United States Patent
Ding et al.

(10) Patent No.: US 9,863,653 B2
(45) Date of Patent: Jan. 9, 2018

(54) CLOSED CIRCULATING WATER COOLING APPARATUS AND METHOD

(75) Inventors: Yigong Ding, Beijing (CN); Weihua Ruan, Henan (CN); Dawei Wang, Henan (CN)

(73) Assignees: State Grid Corporation of China, Beijing (CN); Xuchang Xuji Jing Rui Science & Technology Co., Ltd., Xuchang, Henan (CN)

( * ) Notice: Subject to any disclaimer, the term of this patent is extended or adjusted under 35 U.S.C. 154(b) by 476 days.

(21) Appl. No.: 14/361,893

(22) PCT Filed: May 29, 2012

(86) PCT No.: PCT/CN2012/076187
§ 371 (c)(1),
(2), (4) Date: May 26, 2015

(87) PCT Pub. No.: WO2013/078843
PCT Pub. Date: Jun. 6, 2013

(65) Prior Publication Data
US 2015/0292759 A1    Oct. 15, 2015

(30) Foreign Application Priority Data
Dec. 1, 2011 (CN) .......................... 2011 1 0393323

(51) Int. Cl.
F24F 5/00 (2006.01)
H05K 7/20 (2006.01)
H01L 23/473 (2006.01)

(52) U.S. Cl.
CPC .......... *F24F 5/0046* (2013.01); *H01L 23/473* (2013.01); *H05K 7/20927* (2013.01);
(Continued)

(58) Field of Classification Search
CPC ............ F24F 5/0046; F24F 2005/0057; H05K 7/20945; H01L 23/473; Y02B 10/40
(Continued)

(56) References Cited

U.S. PATENT DOCUMENTS 3,782,132 A * 1/1974 Lohoff ................. F24F 5/0046
165/168
2007/0079623 A1* 4/2007 Inaba .................... F24F 3/1423
62/260

(Continued)

FOREIGN PATENT DOCUMENTS

CN    2294433 Y    10/1998
CN    2561099 Y    7/2003
(Continued)

OTHER PUBLICATIONS

International Search Report Corresponding to International Application No. PCT/CN2012/076186; dated Sep. 6, 2012; 6 Pages.
(Continued)

*Primary Examiner* — Jianying Atkisson
*Assistant Examiner* — Joel Attey
(74) *Attorney, Agent, or Firm* — Myers Bigel, P.A.

(57) ABSTRACT

A closed circulating water cooling apparatus includes an internal cooling apparatus, a plate heat exchanger, and an auxiliary cooling apparatus. The internal cooling apparatus comprises an internal cooling circulator pump and an air cooler. The auxiliary cooling apparatus comprises an external cooling circulator pump and an underground water pipe. Internal cooling water flowing through the plate heat exchanger from the internal cooling apparatus exchanges heat with external cooling water flowing through the plate heat exchanger from the auxiliary cooling apparatus. Utilization of the closed circulating water cooling apparatus and method allows for increased cooling capacity, when the (Continued)

environmental temperature is greater than the maximum inflow water temperature permitted by a piece of technical equipment, for the cooling apparatus to still provide sufficient cooling capacity, and for the equipment to obviate any water loss during operation.

5 Claims, 3 Drawing Sheets

(52) U.S. Cl.
CPC .. *H05K 7/20945* (2013.01); *F24F 2005/0057* (2013.01); *H01L 2924/0002* (2013.01); *Y02B 10/40* (2013.01)

(58) Field of Classification Search
USPC .......................................................... 165/45
See application file for complete search history.

(56) References Cited

U.S. PATENT DOCUMENTS

| | | | |
|---|---|---|---|
| 2010/0071881 A1 | 3/2010 | Murer et al. | |
| 2010/0078160 A1* | 4/2010 | Novotny | F24F 3/06 165/247 |
| 2010/0139736 A1* | 6/2010 | Teichmann | F24J 3/08 136/246 |
| 2010/0326622 A1* | 12/2010 | Maxwell | F24D 3/10 165/45 |

FOREIGN PATENT DOCUMENTS

| | | |
|---|---|---|
| CN | 1632430 A | 6/2005 |
| CN | 1891994 A | 1/2007 |
| CN | 201043863 Y | 4/2008 |
| CN | 201053795 Y | 4/2008 |
| CN | 101473709 A | 7/2009 |
| CN | 201352745 Y | 11/2009 |
| CN | 101694357 A | 4/2010 |
| CN | 201491453 U | 5/2010 |
| CN | 201774788 U | 3/2011 |
| CN | 201852343 U | 6/2011 |
| CN | 201878485 U | 6/2011 |
| CN | 102368615 A | 3/2012 |
| CN | 102435032 A | 5/2012 |
| CN | 102435033 A | 5/2012 |
| CN | 202403477 U | 8/2012 |
| JP | S54146444 A | 11/1979 |
| JP | S59119750 A | 7/1984 |
| JP | S6373879 A | 4/1988 |
| JP | H05136587 A | 6/1993 |
| JP | H07218075 A | 8/1995 |
| JP | 2001010595 A | 1/2001 |

OTHER PUBLICATIONS

International Search Report Corresponding to International Application No. PCT/CN2012/076187; dated Sep. 6, 2012; 8 Pages.
International Search Report Corresponding to International Application No. PCT/CN2012/076189; dated Sep. 27, 2012; 8 Pages.

* cited by examiner

CLOSED CIRCULATING WATER COOLING APPARATUS AND METHOD

RELATED APPLICATIONS

The present application is a 35 U.S.C. §371 national phase application of PCT International Application No. PCT/CN2012/076187, filed May 29, 2012, which claims priority from Chinese Patent Application No. 201110393323.8, filed Dec. 1, 2011, the disclosures of which are hereby incorporated herein by reference in their entireties. PCT International Application No. PCT/CN2012/076187 is published as PCT Publication No. WO 2013/078843 A1.

TECHNICAL FIELD

The present invention relates to the field of cooling apparatus, and more particularly to a closed circulating water cooling apparatus and a method thereof in which cooling water flowing through an air cooler is re-cooled by a plate heat exchanger.

DESCRIPTION OF THE RELATED ART

Nowadays, many power stations and power transmission stations such as converter stations are established in dry and water-shortage regions of North China, where due to high environment temperature and significant evaporation in summer, water resources are becoming more precious than ever. However, traditional water cooling methods for cooling apparatus of power stations and power transmission stations such as converter stations may exhaust scarce water resources in those regions. Thus, air coolers are usually adopted for cooling apparatus used in these power stations. Because, converter stations are always located in geographical positions having relatively lower environment temperature, the application of air coolers may meet the cooling requirement of converters, a kind of processing device used in power stations, and satisfied cooling effects may be achieved.

However, some regions have such high temperature that air coolers are unable to cool the fluid to environment temperature, causing application limitation of air coolers in such dry regions. For example, in some places in Northwest China, the highest extreme environment temperature may come up to 44° C., while the highest inlet temperature that is allowed for converter valves as core equipment of DC transmission projects is only 40° C. In this situation, pure water used for those converts cannot be cooled by air coolers. On the contrary, cooling water may be heated. Thus, air coolers are not suitable in this situation.

Also, because power generation and power transmission facilities generally enter maximum operating conditions in the hottest days in summer when environment temperature reaches its highest extreme value, in which case air coolers usually may not provide enough cooling capability. As a result, converter stations have to operate with reduced payloads, as well as lowered power levels, which may cause economic loss, and has an adverse effect on the development of national economy.

SUMMARY OF THE INVENTION

In view of this, a technical problem to be solved in this invention is to provide a cooling apparatus and improve the cooling capability thereof.

A closed circulating water cooling apparatus comprises an internal cooling apparatus, a plate heat exchanger 6 and an auxiliary cooling apparatus; wherein the internal cooling apparatus comprises an internal cooling circulation pump 2 and an air cooler 3; the auxiliary cooling apparatus comprises an external cooling circulation pump 7 and an underground water pipe 8; heat is exchanged between internal cooling water flowing through the internal cooling apparatus of the plate heat exchanger 6 and external cooling water flowing through the auxiliary cooling apparatus of the plate heat exchanger 6.

According to an apparatus embodiment of this invention, the internal cooling apparatus further comprises a first loop valve 4 and a second loop valve 5; wherein when the first loop valve 4 is opened and the second loop valve 5 is closed, a first loop with internal cooling water circulating therein is formed by the air cooler 3 and a device to be cooled 1; when the first loop valve 4 is closed and the second loop valve 5 is opened, a second loop with internal cooling water circulating therein is formed by the device to be cooled 1, the air cooler 3 and the plate heat exchanger 6; a circulation loop for external cooling water is formed by the plate heat exchanger 6 and the underground water pipe 8.

According to an apparatus embodiment of this invention, when the environment temperature is higher than 17° C., the first loop valve 4 is closed and the second loop valve 5 is opened, in which case the internal cooling water passes through the air cooler 3 and is cooled and then flows into the plate heat exchanger 7 to be cooled again, which then is used to cool the device to be cooled 1; when the temperature of the internal cooling water in the internal cooling apparatus is lower than a cooling water threshold, the first loop valve 4 is closed and the second loop valve 5 is opened, in which case the internal cooling water passes through the plate heat exchanger 7 and is heated by the external cooling water and then is used to cool the device to be cooled 1.

According to an apparatus embodiment of this invention, the internal cooling apparatus further comprises a water temperature sensor and/or an environment temperature sensor, and a control unit which is used to control the opening and closing of the first loop valve 4 and the second loop valve 5 according to a water temperature of the internal cooling water that is measured by the water temperature sensor and/or an environment temperature that is measured by the environment temperature sensor.

According to an apparatus embodiment of this invention, the underground water pipe 8 is buried at a depth of 30 to 50 m under the ground.

According to an apparatus embodiment of this invention, the internal cooling circulation pump 2 and the external cooling circulation pump 6 are in a master-slave redundant configuration.

According to an apparatus embodiment of this invention, the device to be cooled 1 is a converter valve provided in a DC power transmission device.

The cooling apparatus of this invention adopts a plate heat exchanger in connection with an underground water pipe to re-cool internal cooling water passing through an air cooler, so as to improve cooling capability of the cooling apparatus. A problem of unable to cool the fluid to environment temperature or below environment temperature by the air cooler may be solved. Further, because no water is lost during the operation of the apparatus, a purpose of water saving may be achieved. Also, at lower environment temperature in winter, taking advantage of the fact that water in the underground water pipe has a relatively higher temperature, the internal cooling water may be heated to achieve the reduction in energy consumption efficiently.

A technical problem to be solved in this invention is to provide a cooling method to improve cooling capability of a cooling apparatus.

A closed circulating water cooling method comprises cooling a device to be cooled 1 by internal cooling water flowing in an internal cooling apparatus, the internal cooling water passing through a plate heat exchanger 6 and exchanging heat with external cooling water flowing through an auxiliary cooling apparatus of the plate heat exchanger 6, wherein the internal cooling apparatus comprises an internal cooling circulation pump 2 and an air cooler 3; the auxiliary cooling apparatus comprises an external cooling circulation pump 7 and a underground water pipe 8.

According to a method embodiment of this invention, a first loop is formed by the air cooler 3 and the device to be cooled 1 when a first loop valve 4 is opened and a second loop valve 5 is closed, wherein the internal cooling water circulates in the first loop; a second loop is formed by the device to be cooled 1, the air cooler 3 and the plate heat exchanger 6 when the first loop valve 4 is closed and the second loop valve 5 is opened, wherein the internal cooling water circulates in the second loop; a circulation loop for external cooling circulation water is formed by the plate heat exchanger 6 and the underground water pipe 8, wherein the external cooling circulation water circulates in the circulation loop for external cooling circulation water.

According to a method embodiment of this invention, when the environment temperature is higher than 17° C., the first loop valve 4 is closed and the second loop valve 5 is opened, in which case the internal cooling water passes through the air cooler 3 and is cooled and then flows into the plate heat exchanger 7 to be cooled again, which then is used to cool the device to be cooled 1; when the temperature of the internal cooling water in the internal cooling apparatus is lower than a cooling water threshold, the first loop valve 4 is closed and the second loop valve 5 is opened, in which case the internal cooling water passes through the plate heat exchanger 7 and is heated by the external cooling water and then is used to cool the device to be cooled 1.

According to a method embodiment of this invention, the internal cooling apparatus is further provided with a water temperature sensor and/or an environment temperature sensor; wherein a control unit provided in the internal cooling apparatus controls the opening and closing of the first loop valve 4 and the second loop valve 5 according to a water temperature of the internal cooling water that is measured by the water temperature sensor and/or an environment temperature that is measured by the environment temperature sensor.

According to a method embodiment of this invention, the underground water pipe 8 is buried at a depth of 30 to 50 m under the ground.

According to a method embodiment of this invention, the internal cooling circulation pump 2 and the external cooling circulation pump 6 are in a master-slave redundant configuration.

According to a method embodiment of this invention, the device to be cooled 1 is a converter valve provided in a DC power transmission device.

The cooling method of this invention adopts a plate heat exchanger in connection with an underground water pipe to re-cool internal cooling water passing through an air cooler, so as to improve cooling capability of the cooling apparatus. A problem of unable to cool the fluid to environment temperature or below environment temperature by the air cooler may be solved. Further, because no water is lost during the operation of the apparatus, a purpose of water saving may be achieved. Also, at lower environment temperature in winter, taking advantage of the fact that water in the underground water pipe has a relatively higher temperature, the internal cooling water may be heated to achieve the reduction in energy consumption efficiently.

BRIEF DESCRIPTION OF THE DRAWINGS

The accompanying drawings, which constitute a part of the specification, provide a further understanding of this invention. Exemplary embodiments of this invention and their illustrations are given for the purpose of illustrating the present invention, which are not limits of the present invention, in the figures.

DETAILED DESCRIPTION OF THE PREFERRED EMBODIMENT

The cooling apparatus and method of this invention adopts an underground water pipe in connection with a plate heat exchanger to re-cool internal cooling water passing through an air cooler, so as to improve cooling capability of the cooling apparatus.

A description of the technical solution of this invention will be given in terms of many aspects below with reference to the drawings and embodiments.

Figure 1:
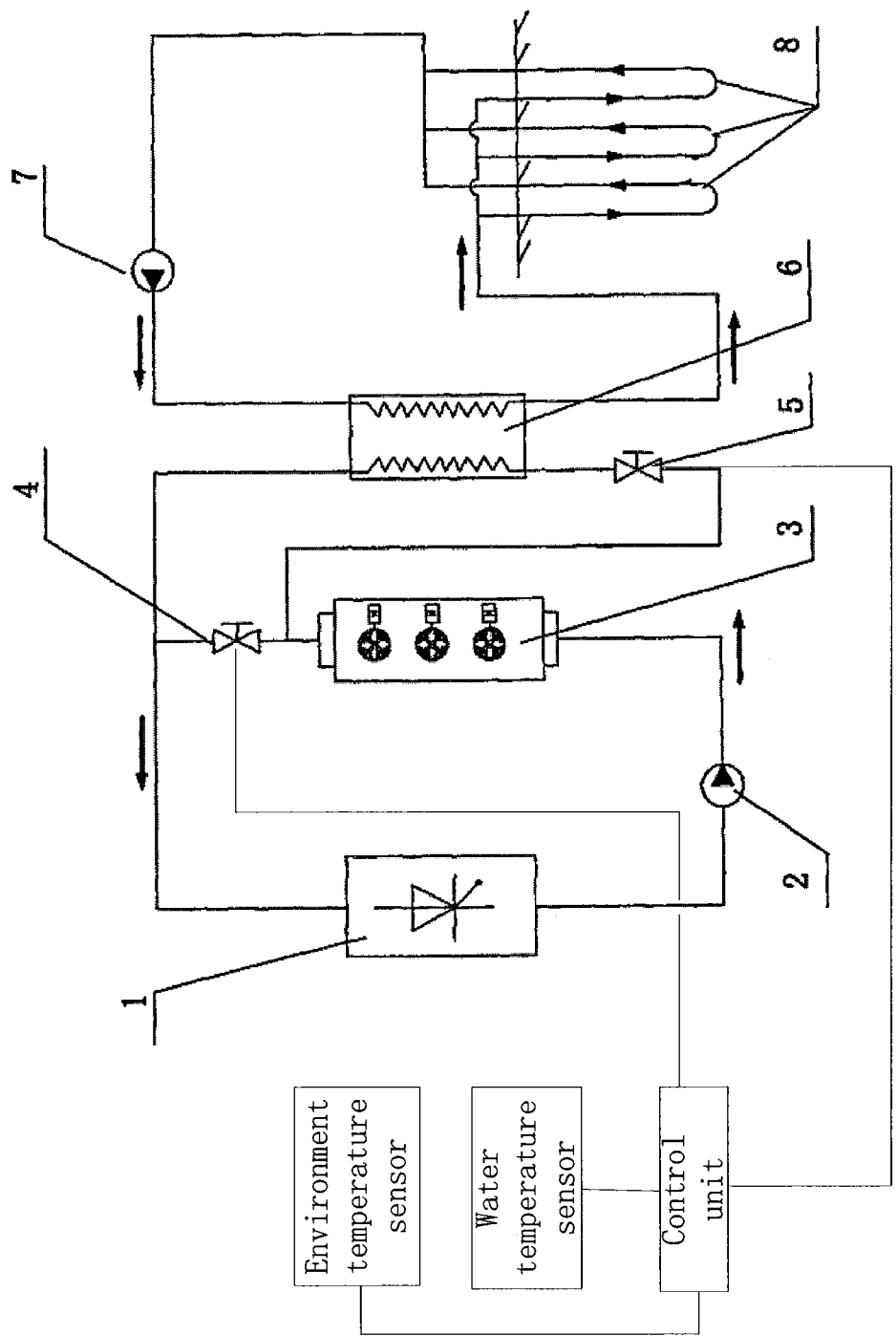
FIG. 1 is a schematic diagram of an embodiment of the cooling apparatus according to this invention.

FIG. 1 is a schematic diagram of an embodiment of the cooling apparatus according to this invention. As shown in FIG. 1, the internal cooling apparatus comprises: an internal cooling circulation pump 2, an air cooler 3, a first loop valve 4, a second loop valve 5; the auxiliary cooling apparatus comprises an external cooling circulation pump 7 and an underground water pipe 8; wherein a loop is formed by the air cooler 3 and the device to be cooled 1 when the first loop valve 4 is opened and the second loop valve 5 is closed; the internal cooling water is powered by the internal cooling circulation pump 2 to circulate in the loop; wherein the internal cooling water is cooled when passing through the air cooler 3, and then is used to cool the device to be cooled 1.

When the first loop valve 4 is closed and the second loop valve 5 is opened, a loop is formed by the device to be cooled 1, the air cooler 3 and the plate heat exchanger 6. The internal cooling water is powered by the internal cooling circulation pump 2 to circulate in the loop, wherein the internal cooling water is cooled when passing through the air cooler 3 and then flows into the plate heat exchanger 6 to be cooled again, which is then used to cool the device to be cooled 1.

External cooling circulation water is powered by the external cooling circulation pump 7 to circulate in a loop formed by the plate heat exchanger 6 and the underground water pipe 8, wherein the external cooling circulation water is cooled by the underground water pipe 8. Wherein, the underground water pipe 8 is a water pipe which is buried deeply underground. External cooling water in the underground water pipe is cooled taking advantage of the fact that the temperature is relatively low and constant under the earth's surface.

According to an embodiment of this invention, there may be one second loop valve provided at the outlet or inlet of the plate heat exchanger 6. There may also be two second loop valves provided at the outlet and inlet of the plate heat exchanger 6, respectively.

According to an embodiment of this invention, the device to be cooled 1 is a converter valve provided in a DC power transmission device, and the internal cooling water is pure water.

According to an embodiment of this invention, the internal cooling water is heated at the converter valve and then is driven by the internal cooling circulation pump 2 to pass through the plate heat exchanger 6, where the internal cooling water is cooled. The cooled internal cooling water is driven by the internal cooling circulation pump 2 and is transported to the converter valve again, and moves in cycles in this manner.

In the case of a relatively higher environment temperature, the first loop valve 4 is closed and the second loop valve 5 is opened. Internal cooling water having some heat dissipated at the air cooler is further cooled by the plate heat exchanger 6 to a temperature range allowable for the industry device. Heat is dissipated from the plate heat exchanger 6 by means of the underground water pipe 8. The air cooler 3 may operate or may not operate. The auxiliary cooling system is started to cool by means of the underground water pipe 8, so that the design load of the internal air cooler is reduced and the footprint of the cooling apparatus may be reduced.

According to an embodiment of this invention, the cooling apparatus of this invention may realize a function of antifreezing and fluid heating in winter by means of the underground water pipe 8. For example, in a converter station of a DC power transmission project, in order to guarantee the safe operation of converter valves, which are a kind of a process device, there is a requirement that the fluid temperature must be higher than a certain value. Taking a converter valve adopted in a DC power transmission project as an example, it is required that the lowest valve inlet temperature must be higher than or equal to 10° C. In the event of a relatively low environment temperature and a lighter load of the converter valve, it is necessary to heat the internal cooling water by an additional heat source.

According to an embodiment of this invention, at a lower environment temperature in winter, when the temperature of the internal cooling water in the internal cooling apparatus is lower than a cooling water temperature threshold, the first loop valve 4 is closed and the second loop valve 5 is opened, in which case the internal cooling water is heated by the external cooling water when passing through the plate heat exchanger 7 and then is used to cool the device to be cooled 1. With the fact that the temperature of water in the underground water pipe 8 is relatively high, through closing the first loop valve 4 and opening the second loop valve 5, the internal cooling water is heated by the plate heat exchanger 6 to a temperature range that is allowable for the process device.

According to an embodiment of this invention, the first loop valve 4 and the second loop valve 5 may be automatic or manual valves.

The internal cooling apparatus further comprises a control unit, which is not shown in FIG. 1, when the temperature of the internal cooling water is higher than a threshold or the environment temperature is higher than a threshold or heating the internal cooling water by external circulating water in winter, the control unit closes the first loop valve 4 and opens the second loop valves 5. The internal cooling apparatus is provided with a water temperature sensor and/or an environment temperature sensor for measuring water temperature of the internal cooling water and the environment temperature.

According to an embodiment of this invention, the internal cooling circulation pump 2 and the external cooling circulation pump 8 may be in a master-slave redundant configuration to improve the operation safety and reliability of the cooling apparatus.

According to an embodiment of this invention, heat is dissipated from the plate heat exchanger 6 to the ground by means of the underground water pipe 8 which is buried underground generally at a depth of 30 to 50 m.

Because the temperature at the layer at a depth of 5 to 10 m under the earth's surface does not vary with the atmospheric temperature, which is always maintained at 15 to 17° C., according to an embodiment of this invention, when the environment temperature exceeds above 17° C., the first loop valve 4 is closed and the second loop valve 5 is opened, so that the internal cooling water is cooled when passing through the air cooler 3 (or the air cooler 3 may not operate at all) and flows into the plate heat exchanger 7 to be cooled again and then is used to cool the device to be cooled 1.

According to an embodiment of this invention, a converter valve cooling system in practice, with the same equivalent cooling capacity (4900 kW, for example), if the designed environment temperature of the air cooler is 38° C., the number of channels that are required for the air cooler is 8 (there are three 11 kW fan motors in each channel) and the size of each channel is 9*3.1 m, the air cooler has a footprint of about 10*25 m; if the designed environment temperature of the air cooler is 17° C., only 4 channels of the same type are required for the air cooler (with a 10% margin or above), and the footprint turns into 9*13 m. In addition to the reduction of the number of channels that are required by the air cooler from 8 to 4, the number of fan motors is changed to 12 from 24, cutting down the footprint by half accordingly. The corresponding plate heat exchanger has the same designed cooling capacity as the air cooler, in which case the plate heat exchanger has a shape size of only 0.9*0.8*1.4 m and a footprint that is negligible.

Figure 2:
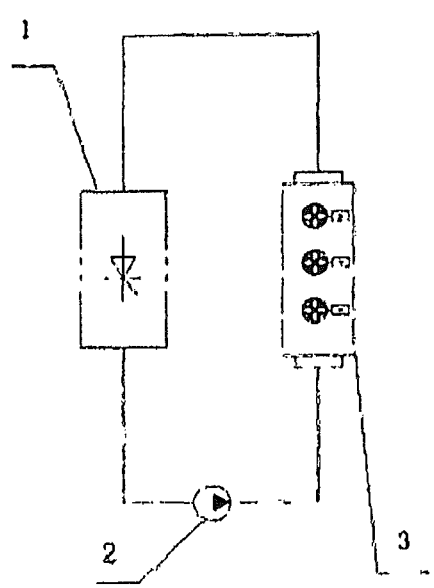
FIG. 2 is a schematic diagram of an operating state of an embodiment of the cooling apparatus according to this invention.

FIG. 2 is a schematic diagram of an operating state of an embodiment of the cooling apparatus according to this invention. As shown in FIG. 2, the internal cooling apparatus comprises: an internal cooling circulation pump 2, an air cooler 3, wherein a loop is formed by the device to be cooled 1 and the air cooler 3; the internal cooling water is powered by the internal cooling circulation pump 2 to circulate in the loop; wherein the internal cooling water is cooled when passing through the air cooler 3 and then is used to cool the device to be cooled 1. The internal cooling water moves in cycles in this manner.

Figure 3:
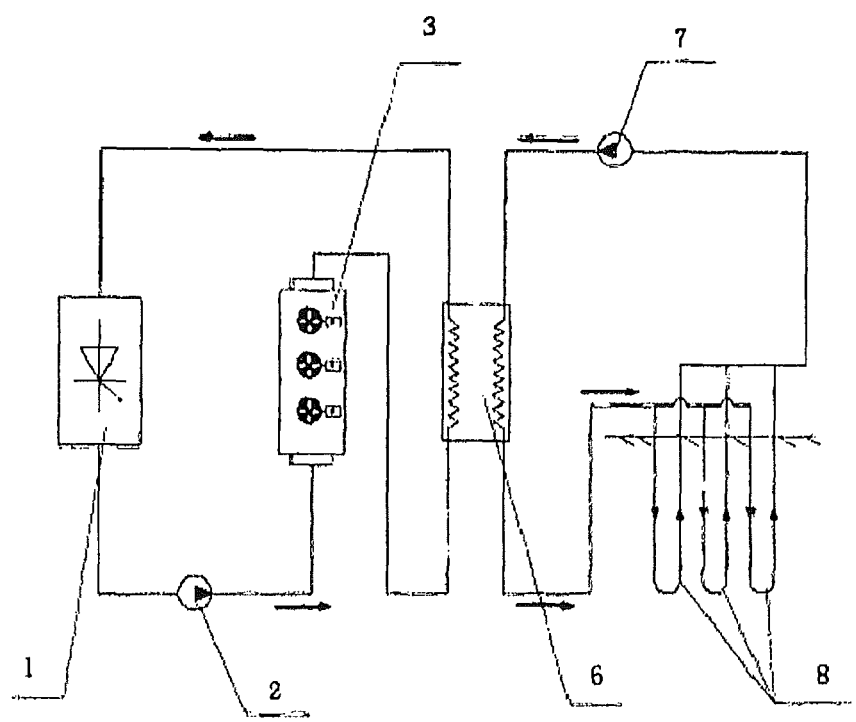
FIG. 3 is a schematic diagram of another operating state of an embodiment of the cooling apparatus according to this invention.

FIG. 3 is a schematic diagram of another operating state of an embodiment of the cooling apparatus according to this invention. As shown in FIG. 3, the internal cooling apparatus comprises an internal cooling circulation pump 2, an air cooler 3; the auxiliary cooling apparatus comprises: an external cooling circulation pump 7 and a underground water pipe 8; wherein external cooling circulation water is powered by the external cooling circulation pump 7 to circulate in a loop formed by the plate heat exchanger 6 and the underground water pipe 8, wherein the underground water pipe 8 is used to cool the external cooling circulation water.

A loop is formed by the device to be cooled 1, the air cooler 3 and the plate heat exchanger 6; internal cooling water is powered by the internal cooling circulation pump 2 to circulate in the loop; wherein after being cooled by the air cooler 3, the internal cooling water enters the plate heat exchanger 6 to be further cooled and then is used to cool the device to be cooled 1; heat is exchanged between the internal cooling water flowing through the plate heat exchanger 6 and the external cooling water flowing through the plate heat exchanger 6, and the internal cooling water moves in cycles in this manner.

It can be seen from the content described above, all of the water closely circulates within the interior of the apparatus without any loss or waste of water, showing a characteristic of zero-water-loss.

The cooling apparatus of this invention may solve the problem that the air cooler is unable to cool the fluid to the environment temperature or below the environment temperature. When the environment temperature is higher than or equal to a maximum inlet water temperature that is allowable for a process device, cooling water may not be cooled by the air cooler at a time. On the contrary, cooling water may be heated. The cooling apparatus of this invention still has enough cooling capability to satisfy the operation requirement of the process device. There is not any water loss during the operation of the cooling apparatus, so that a purpose of water saving may be achieved, and the shortcoming of heavy water consumption caused by cooling towers may be solved. In addition, at low environment temperature in winter, taking advantage of the fact that water in the underground water pipe has a relatively higher temperature, outdoor heat exchanger antifreezing and fluid heating may be realized, which may reduce energy consumption efficiently.

At last it should be noticed that the above embodiments are given for the purpose of illustrating the technical solution of this invention, and are not limitation thereof. Although this invention has been described in detail according to preferable embodiments, those skilled in the art may understand that modifications and substitutions may be made to some technical features of those specific embodiments without departing from the spirit of this invention, which therefore should be encompassed in the scope to be protected by this invention.

What is claimed is:

1. A closed circulating water cooling apparatus, comprising:
    an internal cooling apparatus, a plate heat exchanger and an auxiliary cooling apparatus; wherein the internal cooling apparatus comprises an internal cooling circulation pump and an air cooler;
    the auxiliary cooling apparatus comprises an external cooling circulation pump and a underground water pipe;
    wherein heat is exchanged between internal cooling water flowing through the internal cooling apparatus of the plate heat exchanger and external cooling water flowing through the auxiliary cooling apparatus of the plate heat exchanger;
    the internal cooling apparatus further comprises a first loop valve and a second loop valve;
    wherein when the first loop valve is opened and the second loop valve is closed, a first loop with the internal cooling water circulating therein is formed by the air cooler and a device to be cooled;
    when the first loop valve is closed and the second loop valve is opened, a second loop with internal cooling water circulating therein is formed by the device to be cooled, the air cooler and the plate heat exchanger;
    a circulation loop of external cooling water is formed by the plate heat exchanger and the underground water pipe.

2. The apparatus according to claim 1, wherein the internal cooling apparatus further comprises a water temperature sensor and an environment temperature sensor, and a control unit for controlling to open and close the first loop valve, the second loop valve according to a water temperature of the internal cooling water that is measured by the water temperature sensor and/or an environment temperature that is measured by the environment temperature sensor;
    wherein the control unit is configured to close the first loop and open the second loop when the environment temperature sensor measures that the environment temperature is higher than 17° C., in which case the internal cooling water passes through the air cooler and is cooled and then flows into the plate heat exchanger to be cooled again, which then is used to cool the device to be cooled;
    the control unit is configured to close the first loop and open the second loop when the water temperature sensor measures that the temperature of the internal cooling water in the internal cooling apparatus is lower than a cooling water temperature threshold, in which case the internal cooling water passes through the plate heat exchanger and is heated by the external cooling water and then is used to cool the device to be cooled.

3. The apparatus according to claim 1, wherein the underground water pipe is buried at a depth of 30 to 50 m.

4. The apparatus according to claim 1, wherein the internal cooling circulation pump and the external cooling circulation pump are in a master-slave redundant configuration.

5. The apparatus according to claim 1, wherein the device to be cooled is a converter valve provided in a DC power transmission device.

* * * * *